United States Patent
Sun

(10) Patent No.: US 10,439,566 B2
(45) Date of Patent: Oct. 8, 2019

(54) POWER AMPLIFIER CIRCUIT WITH ADJUSTABLE BIAS VOLTAGE

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventor: Hao Sun, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/902,969

(22) Filed: Feb. 22, 2018

(65) Prior Publication Data
US 2018/0323756 A1    Nov. 8, 2018

(30) Foreign Application Priority Data
May 5, 2017   (CN) .......................... 2017 1 0310036

(51) Int. Cl.
| | |
|---|---|
| *H03F 3/217* | (2006.01) |
| *H03F 1/02* | (2006.01) |
| *H03F 3/21* | (2006.01) |
| *H03F 3/45* | (2006.01) |
| *H03F 3/195* | (2006.01) |
| *H03F 3/24* | (2006.01) |
| *H03F 3/30* | (2006.01) |

(52) U.S. Cl.
CPC ........... *H03F 3/217* (2013.01); *H03F 1/0261* (2013.01); *H03F 1/0288* (2013.01); *H03F 3/195* (2013.01); *H03F 3/211* (2013.01); *H03F 3/2173* (2013.01); *H03F 3/245* (2013.01); *H03F 3/3022* (2013.01); *H03F 3/45* (2013.01); *H03F 3/45192* (2013.01); *H03F 2200/405* (2013.01); *H03F 2200/451* (2013.01)

(58) Field of Classification Search
USPC ...... 330/310, 278, 251, 207 A, 98, 133, 150
See application file for complete search history.

(56) References Cited

U.S. PATENT DOCUMENTS 8,035,443 B2 * 10/2011 Narathong .............. H03F 1/301
                                                        330/278
9,584,085 B2 * 2/2017 Scott ..................... H03F 1/0272

* cited by examiner

*Primary Examiner* — Hieu P Nguyen
(74) *Attorney, Agent, or Firm* — Kilpatrick Townsend & Stockton LLP

(57) ABSTRACT

A power amplifier circuit includes a differential to single-ended converter, a gain stage circuit, a driver stage circuit, and an output stage circuit connected in series, and a bias circuit connected to a bias voltage port of the gain stage circuit for adjusting a bias voltage of the gain stage circuit. The bias voltage is adjustable to ensure low power consumption, improve the efficiency of the power amplifier circuit and prevent process, voltage and temperatures from affecting the performance of the power amplifier circuit.

20 Claims, 8 Drawing Sheets

POWER AMPLIFIER CIRCUIT WITH ADJUSTABLE BIAS VOLTAGE

CROSS-REFERENCES TO RELATED APPLICATIONS

This application claims priority to Chinese patent application No. 201710310036.3, filed on May 5, 2017, the content of which is incorporated herein by reference in its entirety.

FIELD OF THE INVENTION

The present application relates to wireless communications technology. More particularly, embodiments of the present disclosure a power amplifier circuit and a method of forming the same.

BACKGROUND OF THE INVENTION

In recent years, with the rise of wireless communications technology, such as 5G and Internet of Things, and the continuous development of radio frequency (RF) integrated circuits (ICs), handheld wireless communications devices (mobile devices) are today widely used, and wireless communication has experienced explosive growth. Currently, with the development of wireless applications such as Global System for Mobile communications (GSM), General Packet Radio Service (GPRS), Wireless Local Area Network (WLAN), and Low Power Bluetooth (BLE), the share of wireless communications equipment in the commercially available mass market has increased significantly. Consumer demand has turned to low-cost, small size, low power consumption multi-function equipment that includes multimedia features, which promotes the development of the RF IC industry.

BLE (Bluetooth Low Energy) uses a mixed analog-digital integrated circuit design. The analog system mainly includes an RF front-end circuit, and the digital back-end circuit mainly includes a digital baseband processor. A high-frequency power amplifier represents a major portion of a BLE transmitter, its function is to amplify an RF signal to a certain level that can be transmitted by an antenna and received by a specific receiver without being distorted by emitted signals of adjacent channels. Therefore, in order for the transmitted signal to be successfully received at the destination, the signal must be transmitted with sufficient power. As a result, the power amplifier dominates the power consumption of the entire transceiver system.

Conventional power amplifiers are generally classified into different groups: class A, class B, class C, class AB, etc. Their power-added efficiency (PAE) is relatively low, and the power consumption is relatively high. The power amplifier structure is usually a relatively simple single-ended or differential structure, and the on-chip bias voltage of the power amplifier is constant. The performance of the power amplifier is adversely affected by process, temperature, and voltage (PVT) variations.

FIG. 1 is a block circuit diagram of a high-gain high-efficiency power amplifier circuit as known in the prior art. The high-gain high-efficiency power amplifier circuit includes a main amplifier circuit 40 and an auxiliary amplifier circuit 46. Each of the main amplifier circuit and the auxiliary amplifier circuit has multiple amplification stages including a driver stage. A splitter 54 divides an input signal 52 into two signals 56, 58 to provide to two asymmetrical amplifier paths. Main amplifier circuit 40 includes a power amplifier 42 that is biased in a class AB and a power amplifier 44 that is biased in the class AB. Auxiliary amplifier circuit 46 includes a power amplifier biased in a class BC and an amplifier 50 biased in a class C. The power amplifier circuit is referred to as a Doherty amplifier and has a high sensitivity due to the mutual influence of the two amplifier paths. The power amplifier has a relatively high output back-off power and low efficiency. Further, because the two power paths are operating at the same time, the power consumption is relatively high.

FIG. 2 is an RF power amplifier that exhibits high power-added efficiency at high output power. The power amplifier is based on the fact that the switching transistor is either voltage controlled or current controlled, but not both. When the voltage (current) amplitude of the power amplifier remains constant, the power transfer is not only maximized, but the power consumption is also reduced, and the excitation level and the final stage are designed for switching operation. The power amplifier is designed as a relatively simple single-ended structure, and the on-chip bias voltage of the power amplifier is fixed. The performance of the power amplifier is adversely affected by process, temperature, and voltage (PVT) variations.

BRIEF SUMMARY OF THE INVENTION

Embodiments of the present disclosure provide a novel power amplifier circuit that improves the efficiency of the power amplifier and prevents that the efficiency from being adversely affected by process, voltage, and temperature (PVT) variations, and a method of forming the same.

In some embodiments of the present disclosure, a power amplifier circuit includes a differential to single ended converter, a gain stage circuit, a driver stage circuit, and an output stage circuit connected in series, and a bias circuit connected to a bias voltage port of the gain stage circuit for adjusting a bias voltage of the gain stage circuit.

In one embodiment, the bias circuit includes a first current source group including a plurality of first current sources, each of the first current sources having a first terminal connected to a power supply voltage through a switch, and a second terminal connected to the bias voltage port, and a second current source group including a plurality of second current sources, each of the second current sources having a first terminal connected to the bias voltage port through a switch, and a second terminal connected to ground.

In one embodiment, the bias circuit further includes a transmission gate control unit connected to the second terminal of each of the first current source group, the first terminal of each of the second current source group, and the bias voltage port of the gain stage circuit.

In one embodiment, the transmission gate control unit includes a first PMOS transistor having a gate connected to a first terminal of a first switch group and a first terminal of a second switch group, a source connected to the power supply voltage, and a drain connected to a second terminal of the bias voltage port and a second terminal of the second switch group. The transmission gate control unit also includes a first NMOS transistor having a gate connected to a first terminal of a third switch group and a first terminal of a fourth switch group, a drain connected to the bias voltage port and a second terminal of the third switch group, a source connected to ground, the fourth switch group having a second terminal connected to the source of the first NMOS transistor.

In one embodiment, the power amplifier circuit further includes an enable input terminal connected to the gate of a second PMOS transistor of the first switch group, the gate of a third NMOS transistor of the second switch group, the gate of a fourth NMOS transistor of the third switch group, and the gate of a fifth PMOS transistor of the fourth switch group, and an inverted enable input terminal connected to the gate of a second NMOS transistor of the first switch group, the gate of a third PMOS transistor of the second switch group, the gate of a fourth PMOS transistor of the third switch group, and the gate of a fourth NMOS transistor of the fourth switch group.

In one embodiment, the gain stage circuit includes at least one amplifier having an input terminal connected to the bias voltage port, a power supply terminal connected to a power supply voltage, and a ground terminal connected to ground.

In one embodiment, the driver stage circuit includes a plurality of amplifiers connected in cascade. In one embodiment, a subsequent amplifier of the plurality of amplifiers has a gain higher than a gain of a preceding amplifier such that an output signal swing of the subsequent amplifier is higher than an output signal swing of the precedent amplifier.

In one embodiment, each of the plurality of amplifiers is an inverting amplifier.

In one embodiment, the output stage circuit is connected to a series resonant network.

In one embodiment, the output stage circuit includes a class D switching type structure.

In one embodiment, the differential to single ended converter includes a folded cascade structure.

Embodiments of the present invention also provide a method for forming a power amplifier circuit having a differential to single ended converter, a gain stage circuit, a driver stage circuit, an output stage circuit, and a bias circuit. The method includes connecting the differential to single ended converter, the gain stage circuit having a bias voltage port, the driver stage circuit, and the output stage circuit in series, and connecting the bias circuit to the bias voltage port of the gain stage circuit so as to adjust a bias voltage of the gain stage circuit.

In one embodiment, the bias circuit includes a first current source group including a plurality of first current sources, each of the first current sources having a first terminal connected to a power supply voltage through a switch, and a second terminal connected to the bias voltage port; a second current source group including a plurality of second current sources, each of the second current sources having a first terminal connected to the bias voltage port through a switch, and a second terminal connected to ground; and a transmission gate control unit connected to the second terminal of each of the first current source group, the first terminal of each of the second current source group, and the bias voltage port of the gain stage circuit.

In one embodiment, the method further includes adjusting the bias voltage of the gain stage circuit by turning on and off the first current sources of the first current source group and the second current sources of the second current source group.

In one embodiment, the method further includes controlling an operation state of the first current source group and the second source current group through the transmission gate control unit.

In one embodiment, the transmission gate control unit includes a first PMOS transistor having a gate connected to a first terminal of a first switch group and a first terminal of a second switch group, a source connected to the power supply voltage, and a drain connected to a second terminal of the bias voltage port and a second terminal of the second switch group; and a first NMOS transistor having a gate connected to a first terminal of a third switch group and a first terminal of a fourth switch group, a drain connected to the bias voltage port and a second terminal of the third switch group, a source connected to ground, the fourth switch group having a second terminal connected to the source of the first NMOS transistor. The power amplifier also includes an enable input terminal connected to the gate of a second PMOS transistor of the first switch group, the gate of a third NMOS transistor of the second switch group, the gate of a fourth NMOS transistor of the third switch group, and the gate of a fifth PMOS transistor of the fourth switch group; and an inverted enable input terminal connected to the gate of a second NMOS transistor of the first switch group, the gate of a third PMOS transistor of the second switch group, the gate of a fourth PMOS transistor of the third switch group, and the gate of a fourth NMOS transistor of the fourth switch group.

In one embodiment, controlling an operation state of the first current source group and the second source current group through the transmission gate control unit includes turning off the first PMOS transistor and the first NMOS transistor of the transmission gate control unit to set the first current source group and the second current source group in an in active state; and turning on the first PMOS transistor and the first NMOS transistor of the transmission gate control unit to set the first current source group and the second current source group in an active state.

In one embodiment, the first PMOS transistor and the first NMOS transistor in the transmission gate control unit are turned off when the enable input terminal is at a low level. The first PMOS transistor and the first NMOS transistor in the transmission gate control unit are turned on when the enable input terminal is at a high level.

The following description, together with the accompanying drawings, will provide a better understanding of the nature and advantages of the claimed invention.

BRIEF DESCRIPTION OF THE DRAWINGS

The accompanying drawings, referred to herein and constituting a part hereof, illustrate embodiments of the disclosure. The drawings together with the description serve to explain the principles of the disclosure.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It will be understood that the drawings are not drawn to scale, and similar reference numbers are used for representing similar elements. Embodiments of the invention are described herein with reference to functional block diagrams that are schematic illustrations of idealized embodiments (and intermediate structures) of the invention.

It will be understood that, when an element or component is referred to as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

It should be understood that each specific numerical value provided herein is to be construed as merely illustrative and not as a limitation. Accordingly, other examples of exemplary embodiments may have different values.

Figure 1:
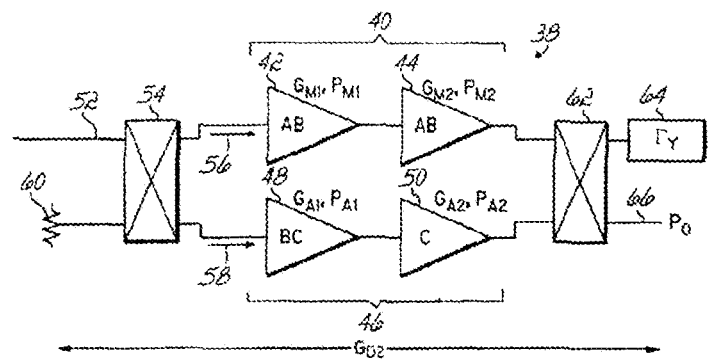
FIG. 1 is a simplified schematic block diagram of a power amplifier circuit in the related art.
Figure 2:
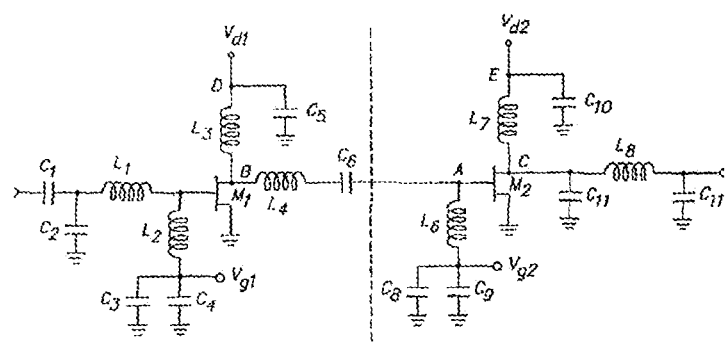
FIG. 2 is a simplified schematic circuit diagram of another power amplifier circuit in the related art.
Figure 3:
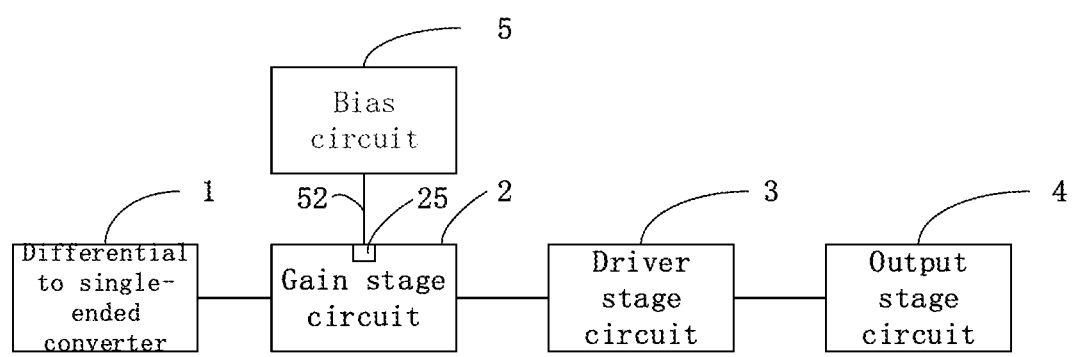
FIG. 3 is a simplified block diagram of a power amplifier according to an embodiment of the present disclosure.

FIG. 3 is a simplified block diagram of a power amplifier circuit according to an embodiment of the present disclosure. Referring to FIG. 3, the power amplifier circuit includes a differential to single-ended converter 1, a gain stage circuit 2, a driver stage circuit 3, output stage circuit 4, and a bias circuit 5. Differential to single-ended converter 1, gain stage circuit 2, driver stage circuit 3, and output stage circuit 4 are connected in series in this given order. Bias circuit 5 is connected to a bias voltage port 25 of gain stage circuit 2 for adjusting a bias voltage of gain stage circuit 2. Differential to single-ended converter 1 may be implemented by a folded cascode of a class A differential to single ended converter for minimizing the loading of a local oscillator (LO) buffer while providing a common mode rejection and amplifying a mirror output through the gain stage circuit to a rail-to rail swing (i.e., full swing).

In the embodiment, bias circuit 5 supplies a bias voltage 52 to bias voltage port 25 of gain stage circuit 2. The bias voltage is adjustable to reduce or prevent adverse effects of process, voltage and temperature (PVT) variations on the performance of the power amplifier circuit, thereby improving the efficiency of the power amplifier circuit while ensuring low power consumption.

Figure 4:
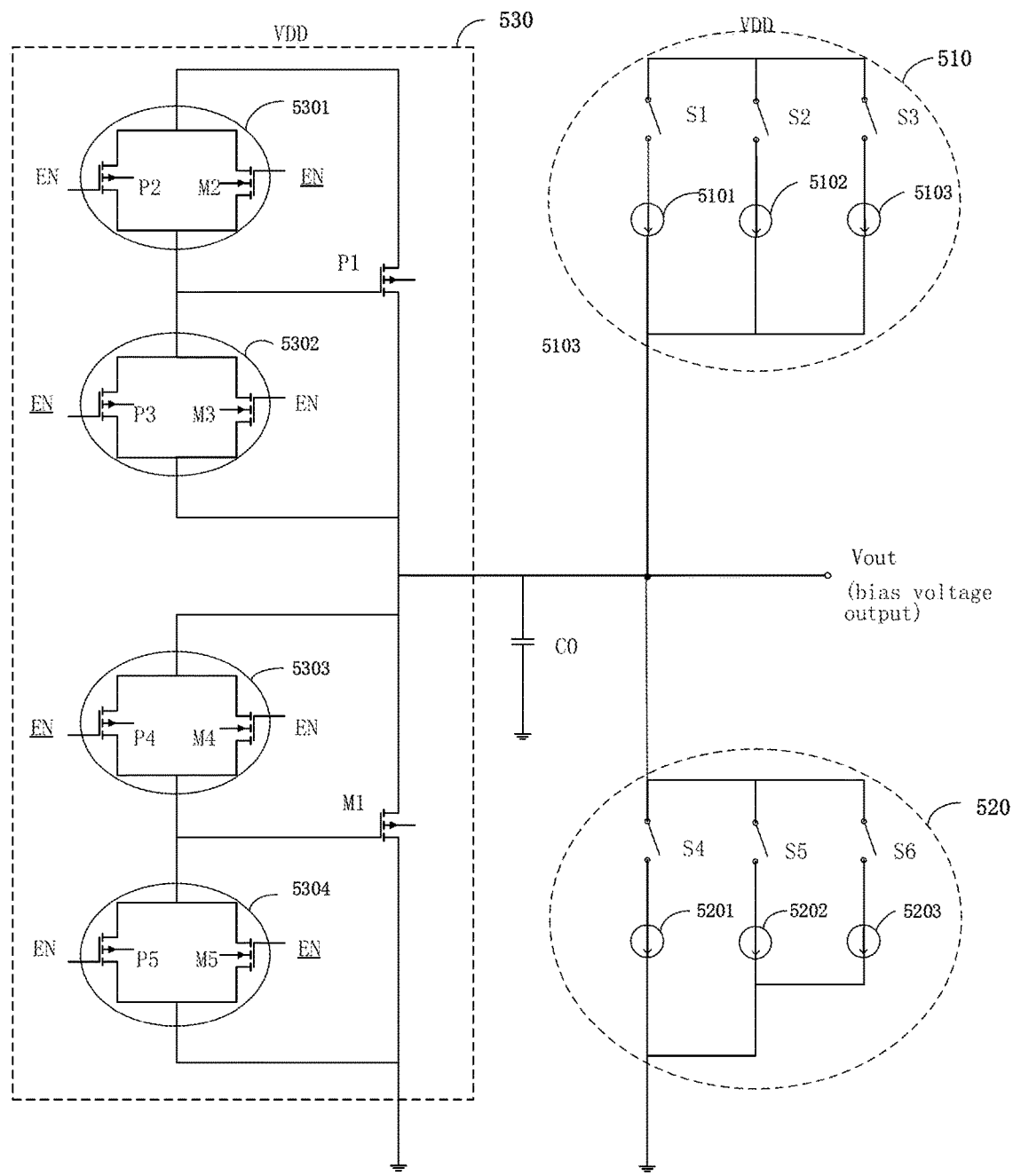
FIG. 4 is a simplified circuit diagram of a bias circuit according to an embodiment of the present disclosure.

FIG. 4 is a simplified circuit diagram of a bias circuit according to an embodiment of the present disclosure. Referring to FIG. 4, the bias circuit includes a first current source group 510 and a second current source group 520. First current source group 510 and second current source group 520 may each include a plurality of current sources. Each current source of first current source group 510 has a first terminal connected to a power supply voltage VDD through a switch and a second terminal connected to a bias voltage port of the gain stage circuit. Each current source of second current source group 520 has a first terminal connected to the bias voltage port of the gain stage circuit through a switch and a second terminal connected to ground. The signal Vout is the bias voltage provided to the bias voltage port of the gain stage circuit.

In the embodiment, by turning on and off of the current sources of the first current source group and the second current source group, it is possible to determine the direction of the current flow (whether the current flows into or out of the bias circuit) to adjust the magnitude of the bias voltage, i.e., adjust the magnitude and direction of the bias voltage of the power amplifier circuit, thereby preventing the performance of the power amplifier circuit from being affected by PVT variations.

It is understood that the number of current sources in the first current source group and the second current source group can be any integer number. In the example shown in FIG. 4, three current sources 5101, 5102, 5103 are used in the first current source group and three current sources 5201, 5201, 5203 are used in the second current source group. But it is understood that the number is arbitrary chosen for describing the example embodiment and should not be limiting. In the example shown in FIG. 4, when switches S1-S3 are turned on, and switches S4-S6 are turned off, a current flows in the bias circuit, i.e., the bias voltage Vout has a positive value and supplies a forward bias voltage to the gain stage circuit of the power amplifier circuit. When switches S1-S3 are turned off and switches S4-S6 are turned on, the current flows out, i.e., the bias voltage Vout has a negative value and supplies a reversed bias voltage to the gain stage circuit of the power amplifier circuit. In addition, the magnitude of the bias voltage can be adjusted by combining switches S1, S2, S3, i.e., by turning on and off one or more of switches S1, S2, and S3.

In the embodiment, the bias voltage can be provided to the gain stage circuit through the first and second current source groups. Since the first and second current source groups are symmetrical, lower even harmonics are substantially equal in size and opposite in direction, and the offset voltage calibration is performed only one time at nominal operating conditions and in the same direction, so that it is possible to suppress the lower even harmonics.

In another embodiment, the bias circuit may also include a transmission gate control unit 530 connected to the second terminal of first current source group 510, the first terminal of second current source group 520, and the bias voltage port, respectively. In addition, transmission gate control unit 530 may be connected to ground through a capacitor C0, which is configured to block a direct (DC) current to prevent current and voltage leakage.

Transmission gate control unit 530 is configured to control operating states of first current source group 510 and second source group 520. Transmission gate control unit 530 includes a first PMOS transistor P1 and a first NMOS transistor M1, that can be controlled through steep edges of duty cycles of some transmission gates according to PVT variations of the NMOS and PMOS devices. The first PMOS transistor P1 has a gate connected to a first terminal of a first switch group 5301 and a first terminal of a second switch group 5302, respectively, a source connected the power supply voltage VDD and a second terminal of first switch group 5301, and a drain connected to the bias voltage output and a second terminal of second switch group 5303, respectively. First NMOS transistor M1 has a gate connected to a first terminal of a third switch group 5303 and a first terminal of a fourth switch group 5304, a drain connected to the bias voltage output and a second terminal of third switch group 5303, and a source connected to ground. The second terminal of fourth switch group 5304 is connected to the source of first NMOS transistor M1.

Specifically, first switch group 5301 include a PMOS transistor P2 and an NMOS transistor M2. Second switch group 5302 include a PMOS transistor P3 and an NMOS transistor M3. Third switch group 5303 include a PMOS transistor P4 and an NMOS transistor M4. Fourth switch group 5304 include a PMOS transistor P5 and an NMOS transistor M5. PMOS transistor P2, NMOS transistor M3, NMOS transistor M4, and PMOS transistor P5 are connected to an enable terminal EN. NMOS transistor M2, PMOS transistor P3, PMOS transistor P4, and NMOS transistor M5 are connected to inverted enable terminal $\overline{EN}$. The inverted enable terminal $\overline{EN}$ has a polarity opposite of that of enable terminal EN. For example, when EN is 0, PMOS transistor P2 and NMOS transistor M2 are turned on, and PMOS transistor P3 and NMOS transistor M3 are turned off. That is, the gate voltage of first PMOS transistor P1 is 1, so that first PMOS transistor is turned off. PMOS transistor P4 and NMOS transistor M4 are turned off, PMOS transistor P5 and NMOS transistor M5 are turned on, and the gate voltage of first NMOS transistor M1 is zero, so that first NMOS transistor M1 is also turned off. When the signal EN is 1, PMOS transistor P2 and NMOS transistor M2 are turned off, PMOS transistor P3 and NMOS transistor M3 are turned on, and the gate voltage of first PMOS transistor P1 is 1, so that first PMOS P1 is turned on. At the same time, PMOS transistor P4 and NMOS transistor M4 are turned on, PMOS transistor P5 and NMOS transistor M5 are turned off, and the gate voltage of first NMOS transistor M1 is 1, so that first NMOS transistor M1 is also turned on. That is, when the signal EN is 1, there is a potential difference between first PMOS transistor P1 and first NMOS transistor M1 to supply a fixed voltage to first current source group 510 and second current source group 520, and first current source group 510 and second current source group 520 are in an active state. When the signal EN is 0, first current source group 510 and second current source group 520 are in an inactive state.

In the embodiment, the transmission gate control unit in the bias circuit controls the operating states of the first current source group and the second current source group. When the first current source group and the second current source group are in the active state, the magnitude and direction of the bias voltage of the power amplifier circuit can be adjusted to ensure low power consumption and improve the efficiency the power amplifier circuit while improving the gain of the power amplifier circuit and suppress even harmonics at the same time.

Figure 5:
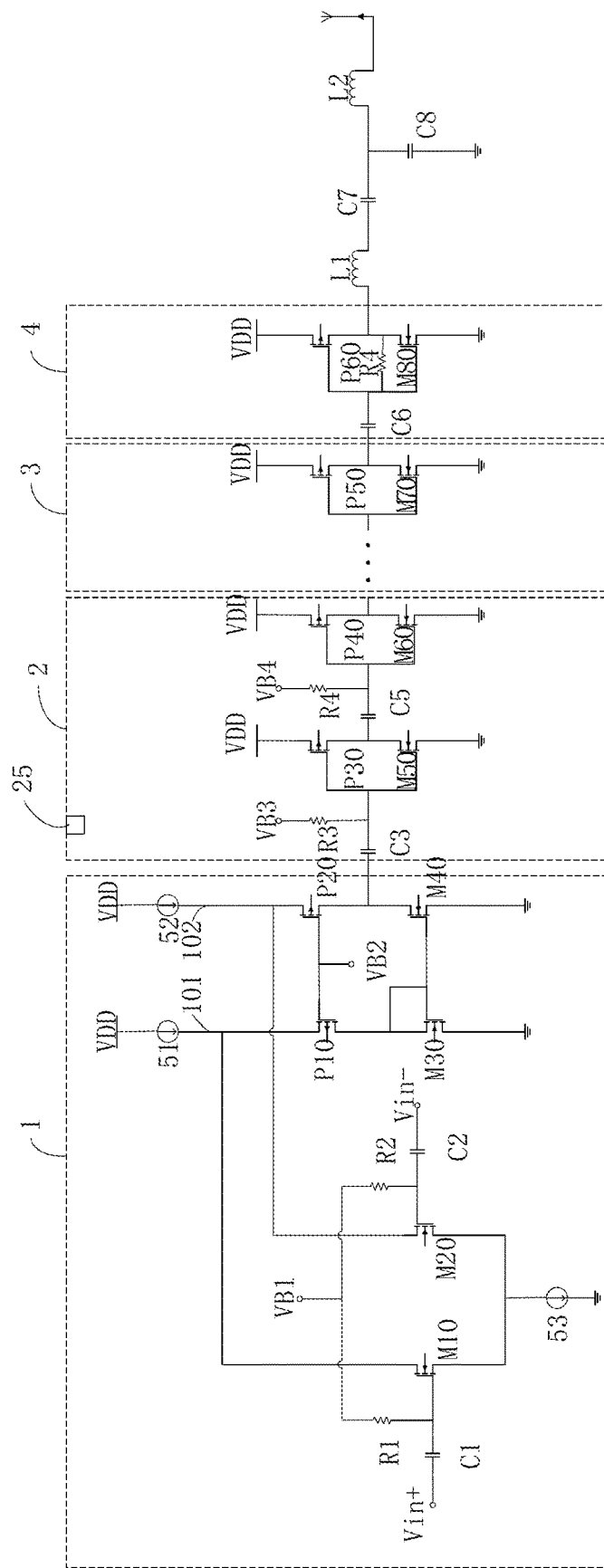
FIG. 5 is a simplified circuit diagram of a power amplifier circuit according to an embodiment of the present disclosure.

FIG. 5 is a simplified circuit diagram of a power amplifier circuit according to an embodiment of the present disclosure. Referring to FIG. 5, the power amplifier circuit includes a differential to single ended converter 1, a gain stage circuit 2, a driver stage circuit 3, an output stage circuit 4. A bias circuit 5 as the one shown in FIG. 4 is not shown in FIG. 5.

Differential to single ended converter 1 has a folded cascode structure that converts a differential input signal into a single ended signal to minimize the load of the local oscillator (LO) buffer while providing a common mode rejection and enabling the amplification of a mirror output signal to a rail-to-rail swing (i.e., full swing) through the gain stage circuit. In the specific embodiment of FIG. 5, differential to single ended converter 1 includes a capacitor C1 that has a first terminal connected to a positive signal input Vin+ and a second terminal connected to a power source VB1 through a resistor R1; a capacitor C2 that has a first terminal connected to a negative signal input Vin− and a second terminal connected to the power source VB1 through a resistor R2; an NMOS transistor M10 having a gate connected to the second terminal of capacitor C1, a source connected to ground through a current source 53, and a drain connected to the power supply VDD on a first branch 101 through a current source 51, an NMOS transistor M20 having a gate connected to the second terminal of capacitor C2, a source connected to ground through current source 51, and a drain connected to the power supply VDD on a second branch 102 through a current source 52.

Differential to single-ended converter 1 also includes a PMOS transistor P10 having a gate connected a power source VB2, a source connected to the power supply VDD through current source 51, and a drain connected to a drain of an NMOS transistor M30. NMOS transistor 30 has a source connected to ground, a gate connected to the drain of NMOS transistor 30 and connected to a gate of an NMOS transistor M40. Differential to single ended converter 1 also includes a PMOS transistor P20 having a gate connected power source VB2, a source connected to the power supply VDD through current source 52, and a drain connected to a drain of NMOS transistor M40. NMOS transistor 40 has a source connected to ground. The drain of PMOS transistor P20 is connected to the drain of NMOS transistor M40 as an output terminal of differential to single ended converter 1.

The input signal of the power amplifier circuit is provided by a clock signal generated by a phase-locked loop (PLL) and is output by a local oscillator (LO) buffer. However, the size of the transistors of the driver stage circuit and the output stage circuit is relatively large, and if the input signal of the gain stage circuit or driver stage circuit is directly connected the LO buffer output, the input signal would present a large load to the output of the LO buffer. By connecting the differential to single ended converter with the output of the LO buffer, the load to the LO buffer is reduced because the size of the input transistor of the differential to single-ended converter is smaller relative to the transistor size of the driver stage circuit and the output stage circuit. Further, since the differential input signal includes two equal-magnitude input signals of opposite phase to each other, the clock signal has the same interference to the two input signals, so that the difference of the two input signals is kept constant, the differential to single-ended converter can also provide a common mode rejection, and the mirror output can be amplified by the gain stage circuit to a rail-to-rail swing.

Gain stage circuit 2 has an input terminal connected the output terminal of differential to single ended converter 1, and an output terminal connected to an input terminal of driver stage circuit 3. Gain stage circuit 2 includes at least one amplifier, such as an inverting amplifier having an input connected to a bias voltage port, a power supply terminal connected to the supply voltage, and a ground terminal connected to ground. Referring to FIG. 5, gain stage circuit 2 includes two inverting amplifiers, wherein the input of the first stage inverting amplifier is connected to a voltage VB3 through a resistor R3. Voltage VB3 is a bias voltage of the bias voltage port. Gain stage circuit 2 has a capacitor C3 having a first terminal connected to the output terminal of differential to single ended converter 1 and a second terminal connect to voltage VB3 through resistor R3. The second stage inverting amplifier input has an input connected to a voltage VB4 through a resistor R4. VB4 is the bias voltage of the bias voltage port. The input of the second stage inverting amplifier is connected to the output of the first stage inverting amplifier through a capacitor C5. Resistor R3 and resistor R4 operate as AC components. Capacitor C3 and capacitor C5 operate as DC components. It is understood that the number of stage inverting amplifiers in the gain stage circuit can be any integer number. In the example shown in FIG. 5, two stage inverting amplifiers are used, but it is understood that the number is arbitrarily chosen for describing the example embodiment and should not be limiting.

The gain stage circuit can provide sufficient gain for the power amplifier circuit, so that the input signal can be amplified to meet specific requirements, and the power level circuit (i.e., the output stage circuit) can focus on the core task of the power amplification. In the related art, if the gain provided by the driver stage circuit is not sufficiently high, the power stage circuit is required to increase the gain to satisfy the design requirements, which increases the difficulty of the power stage circuit design and may reduce the overall efficiency of the power amplifier circuit. The gain stage circuit according to the embodiment of the present disclosure provides a bias voltage through a bias circuit to increase the gain of the power amplifier circuit.

Referring to FIG. 5, driver stage circuit 3 is a cascaded amplifier including a plurality of amplifying stages connected in series. Each amplifying stage can be an inverting amplifier, the plurality of amplifying stages of driver stage circuit 3 may have an increasing gain to form a chain of amplifiers. Driver stage circuit 3 is capable of amplifying signals through the inverter chain stage-by-stage to a full swing having steep rising and falling edges. Referring to FIG. 5, although only one inverting amplifier including a PMOS transistor P50 and an NMOS transistor M70 is shown, it is, however, understood that any integer number of cascaded amplifiers (amplifying stages) can be used in practical applications.

Output stage circuit 4 has an input terminal connected to an output terminal of driver stage circuit 5 through a capacitor C6 and an output terminal connected to a series resonant network. Output stage circuit 4 is capable of raising the power of an RF signal transmitted from driver stage circuit 3 to a level that satisfies system requirements, so that the power amplifier circuit has a sufficient output power to ensure high efficiency. Output stage circuit 4 is a class D switching type structure that can improve the drain efficiency of the power amplifier circuit by increasing the switching rate (speed) of an NMOS transistor M80 and a PMOS transistor P60. The specific switching speed needs to be determined according to the efficiency and output power required by the power amplifier circuit. Further, since the output terminal of output stage circuit 4 is connected to a L1 and C7 series resonant network so that the power resonance is in the 2.4 GHz frequency band, the higher harmonics can be limited to the output port of the inverting amplifier to enhance the efficiency of the power amplifier circuit that is beneficial to achieve output power matching.

In the embodiment, a class A differential folded cascode structure is used to implement the differential to single-ended converter that minimizes the load on the LO buffer while providing a common mode rejection and maximizing the mirror output to a rail-to-rail swing through the gain stage circuit. Further, the gains stage circuit and the driver stage circuit amplify the signal stage-by-stage through a chain of cascaded inverting amplifiers having an increasing gain to have a full swing with steep rising and falling edges. In addition, the drain efficiency of the output stage circuit can be improved by increasing the switching speed of the NMOS transistor and the PMOS transistor of the output stage circuit. The efficiency of the power amplifier circuit can be further improved by adjusting the bias voltage of the gain stage circuit through a bias circuit to prevent the performance of the power amplifier circuit from being affecting by PVT variations while ensuring low power consumption, the gain of the power amplifier circuit can be improved and even harmonics can be suppressed at the same time.

Figure 6:
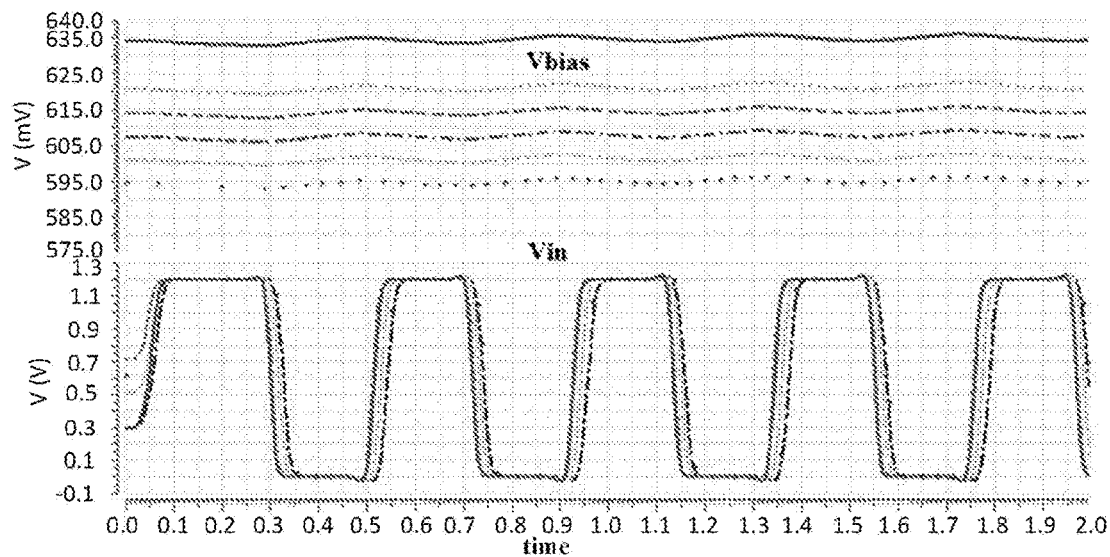
FIG. 6 is a graph illustrating simulation results of a gain level bias voltage and input signal voltage of a power amplifier according to an embodiment of the present disclosure.

FIG. 6 is a graph illustrating simulation results of a gain level bias voltage and input signal voltage of a power amplifier according to an embodiment of the present disclosure. The upper portion of FIG. 6 shown the bias voltage Vbias and the lower portion of FIG. 6 shows the rising edges and falling edges of an input signal Vin. For example, the bias voltage Vbias can be increased from 580 mV to 635 mV, the rising and falling edges of the input signal Vin become steeper by controlling the magnitude and direction of the bias voltage by turning on and off the current sources of the bias circuit shown in FIG. 4.

Figure 7:
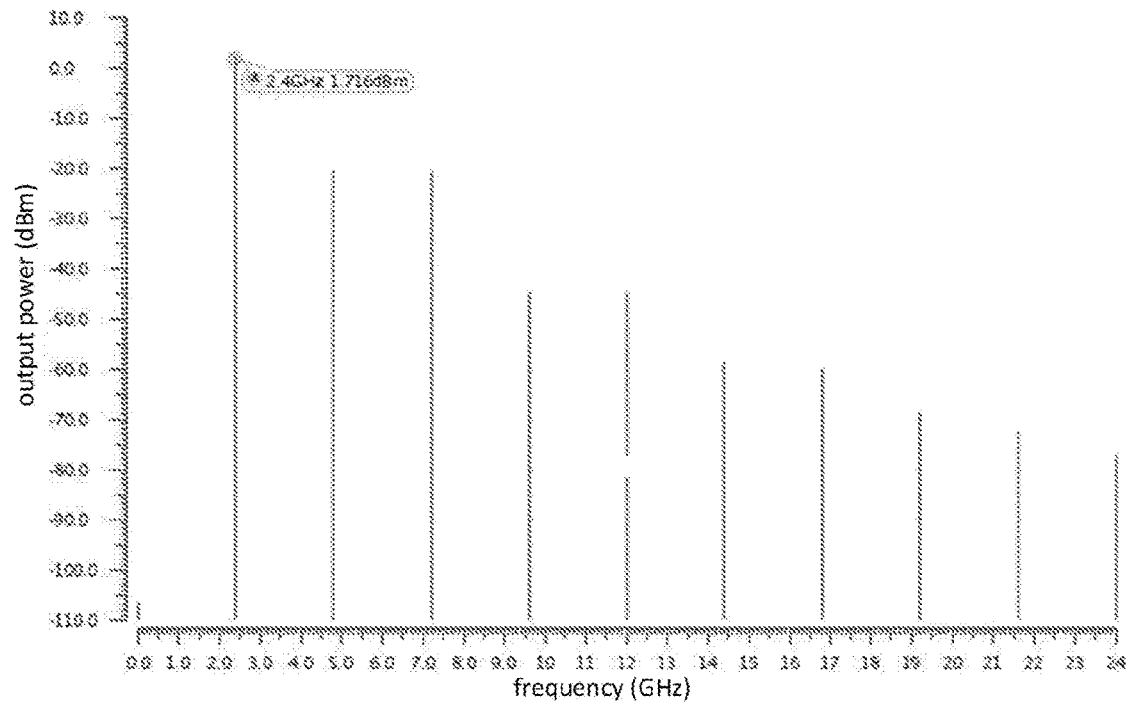
FIG. 7 is a graph illustrating simulated output power levels of a power amplifier circuit according to an embodiment of the present disclosure.

FIG. 7 is a graph illustrating simulated output power levels of a power amplifier circuit according to an embodiment of the present disclosure. The x-axis represent the frequency in GHz, and the y-axis represents the output power in dBm. When the supply voltage VDD is 1.2V, the output power of the power amplifier circuit is 1.72 dBm at a frequency of 2.4 GHz.

Figure 8:
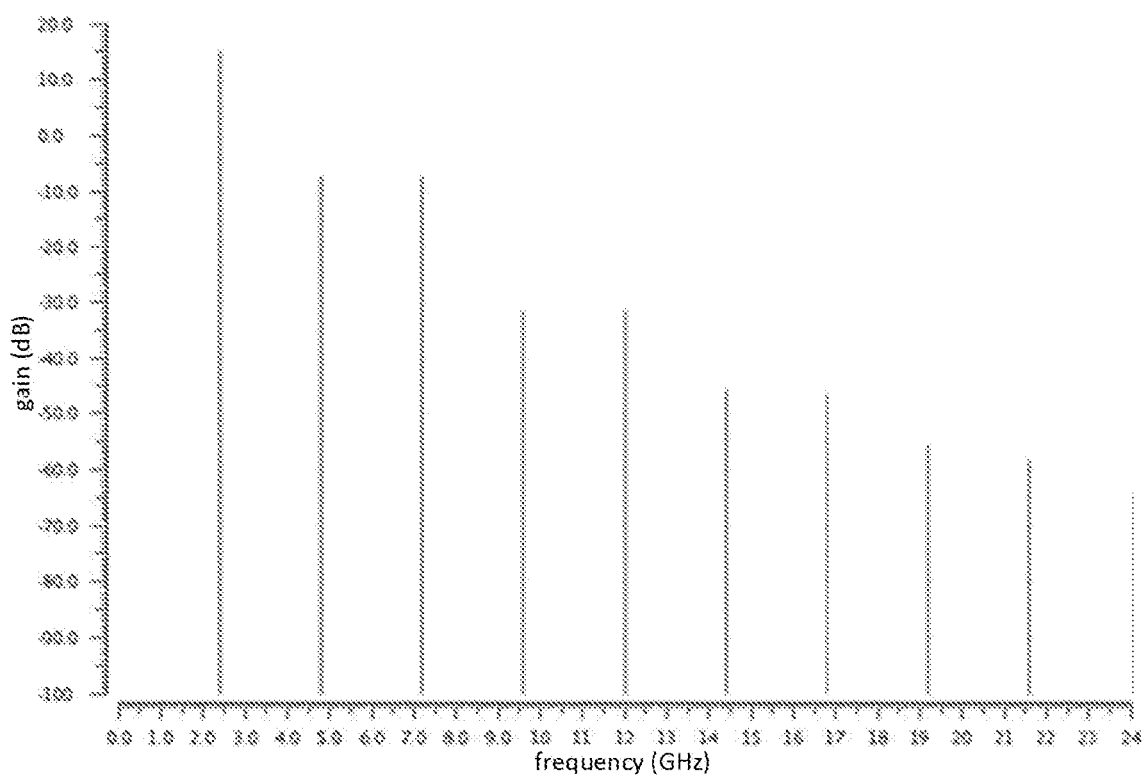
FIG. 8 is a graph illustrating simulated power gain of a power amplifier circuit according to an embodiment of the present disclosure.

FIG. 8 is a graph illustrating simulated power gains of a power amplifier circuit according to an embodiment of the present disclosure. The x-axis represent the frequency in GHz, and the y-axis represents the gain of the power amplifier circuit in dB. The power gain is about 15.01 dB at 2.4 GHz.

Figure 9:
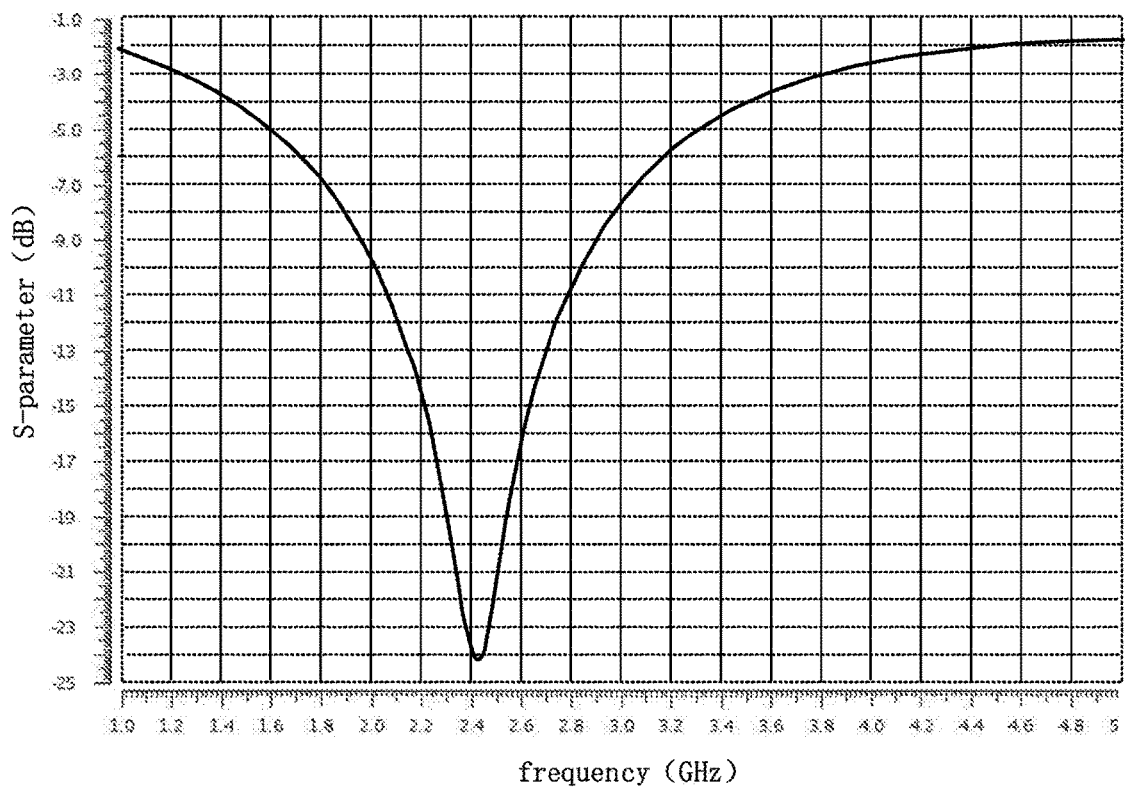
FIG. 9 is a graph illustrating an output return loss of a power amplifier circuit according to an embodiment of the present disclosure.

FIG. 9 is a graph illustrating an output return loss of a power amplifier circuit according to an embodiment of the present disclosure. Since the power amplifier circuit is a BLE power amplifier, the differential to single-ended converter is the buffer of the differential signal provided by the LO, so no input matching is required, only the output matching is required. Referring to FIG. 9, the output return loss S11 is lower than −20 dB (e.g., <−24 dB), that is, the signal is not reflected, and the signal is transmitted to the load with basically no loss.

Figure 10:
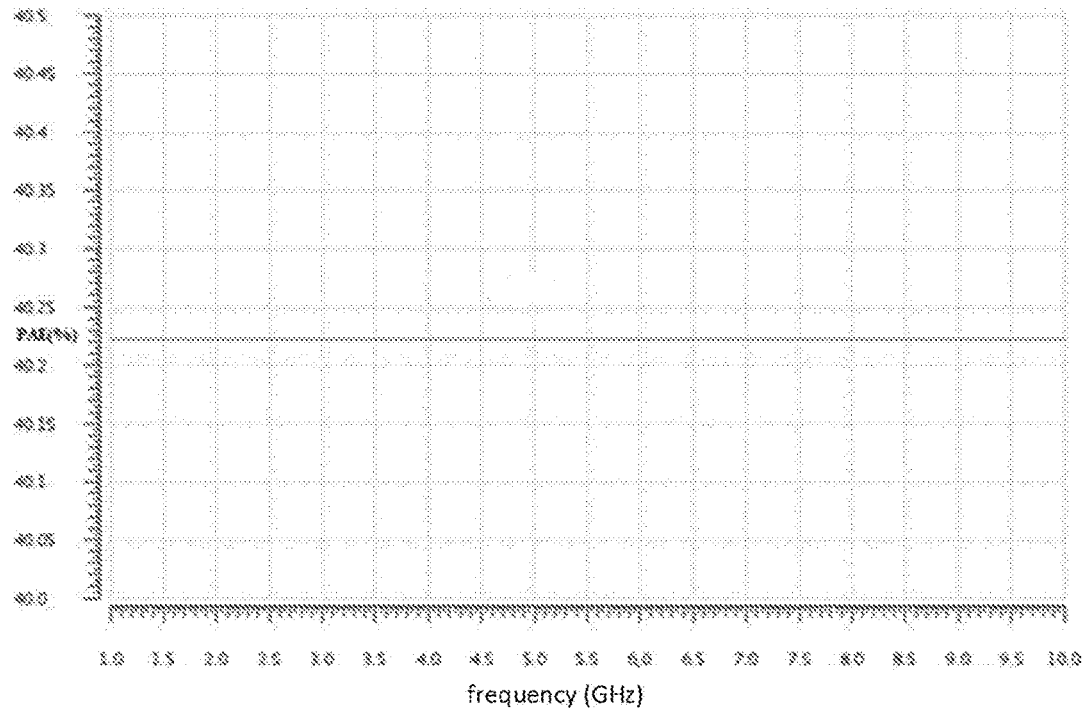
FIG. 10 is a graph illustrating a simulated power added efficiency (PAE) of a power amplifier circuit according to an embodiment of the present disclosure.

FIG. 10 is a graph illustrating a simulated power added efficiency (PAE) of a power amplifier circuit according to an embodiment of the present disclosure. The simulated power added efficiency (PAE) of the power amplifier circuit is about 40.23%. The average current consumed by the power amplifier circuit is calculated to be 1.38 mA using a transient simulation. Therefore, the power amplifier circuit of the present disclosure has better performance than conventional power amplifier circuits.

Figure 11:
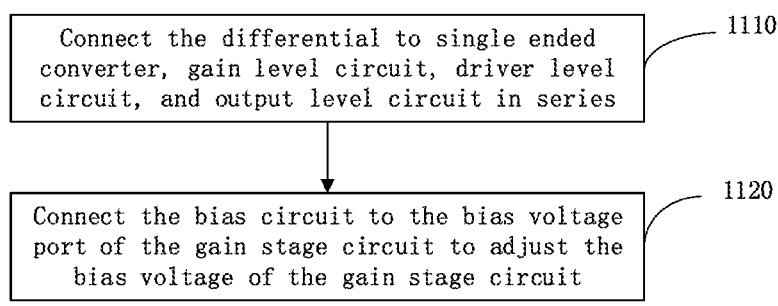
FIG. 11 is a simplified flowchart of a method of forming a power amplifier circuit according to an embodiment of the present disclosure.

FIG. 11 is a simplified flowchart of a method for forming a power amplifier circuit according to an embodiment of the present disclosure. The method may include:

At step 1110: connecting a differential to single-ended converter, a gain level circuit, a driver circuit, and an output level circuit in series in this order.

At step 1120: connect a bias circuit to a bias voltage port of the gain stage circuit to adjust the bias voltage of the gain stage circuit.

The bias voltage of the gain stage circuit can be adjusted by turning on and off the current sources of the first current source group and the current sources of the second current source group. In the exemplary embodiment of FIG. 4, when switches S1-S3 are turned on and switches S4-S6 are turned off, a current flows in the gain stage circuit, i.e., the signal Vout has a positive value and supplies a forward bias voltage to the gain stage circuit of the power amplifier circuit. When switches S1-S3 are turned off, and switches S4-S6 are turned on, the current flows out of the gain stage circuit, i.e.e., the signal Vout has a negative value and supplies a reversed bias voltage to the gain stage circuit of the power amplifier circuit. Further, switches S1-S3 can be turned on and off in any combination, i.e., by turning on or off any or more switches, the magnitude of the bias voltage can be adjusted.

Further, the operating states of the first current source group and the second current source group can be controlled using a transfer gate control unit of the bias circuit. In an exemplary embodiment, when the first PMOS transistor and the first NMOS transistor in the transfer gate control unit are turned off, the first current source group and the second current source group each are in the active state (operating state). When the enable signal is low, the first PMOS transistor and the first NMOS transistor in the transfer gate control unit are turned off. Conversely, when the enable signal is high, the first PMOS transistor and the first NMOS transistor in the transfer gate control unit are turned on. In the bias circuit shown in FIG. 4, the inverted enable signal EN and the enable signal EN have opposite phases.

In the embodiment, the bias voltage (52 in FIG. 3) is provided to the bias voltage port (e.g., 25 in FIG. 3) of the gain stage circuit through the bias circuit. The bias voltage can be adjusted to prevent the performance of the power amplifier circuit from being affected by PVT variations, thereby enabling low power consumption and improving the efficiency of the power amplifier circuit.

The method and device of the present disclosure may be implemented in a number of ways. For example, the method and device of the present disclosure may be implemented by software, hardware, firmware, or any combination of software, hardware, and firmware. Those of skill in the art will appreciate that the order of steps of the described method is for illustration only, and the steps of the method of the present disclosure are not limited to the above-described sequences. Further, in some embodiments, the present disclosure may be implemented as a program stored in a recording medium, which includes machine-readable instructions executable by a processor. Thus, the present disclosure also covers a recording medium that stores a program for executing the method according to the present disclosure.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

What is claimed is:

1. A power amplifier circuit, comprising:
a differential to single ended converter, a gain stage circuit, a driver stage circuit, and an output stage circuit connected in series; and
a bias circuit connected to a bias voltage port of the gain stage circuit for adjusting a bias voltage of the gain stage circuit, the bias circuit comprising:
a first current source group including a plurality of first current sources, each of the first current sources having a first terminal connected to a power supply voltage through a first switch, and a second terminal connected to the bias voltage port; and
a second current source group including a plurality of second current sources, each of the second current sources having a third terminal connected to the bias voltage port through a second switch, and a fourth terminal connected to ground.

2. The power amplifier circuit of claim 1, wherein the bias circuit further comprises:
a transmission gate control unit connected to the second terminal of each of the first current source group, the third terminal of each of the second current source group, and the bias voltage port of the gain stage circuit.

3. The power amplifier circuit of claim 2, wherein the transmission gate control unit comprises:
a first PMOS transistor having a gate connected to a first terminal of a first switch group and a first terminal of a second switch group, a source connected to the power supply voltage, and a drain connected to a second terminal of the bias voltage port and a second terminal of the second switch group; and
a first NMOS transistor having a gate connected to a first terminal of a third switch group and a first terminal of a fourth switch group, a drain connected to the bias voltage port and a second terminal of the third switch group, a source connected to ground, the fourth switch group having a second terminal connected to the source of the first NMOS transistor.

4. The power amplifier circuit of claim 3, further comprising:
an enable input terminal connected to the gate of a second PMOS transistor of the first switch group, the gate of a third NMOS transistor of the second switch group, the gate of a fourth NMOS transistor of the third switch group, and the gate of a fifth PMOS transistor of the fourth switch group;

an inverted enable input terminal connected to the gate of a second NMOS transistor of the first switch group, the gate of a third PMOS transistor of the second switch group, the gate of a fourth PMOS transistor of the third switch group, and the gate of a fourth NMOS transistor of the fourth switch group.

5. The power amplifier circuit of claim 1, wherein the gain stage circuit comprises:
at least one amplifier having an input terminal connected to the bias voltage port, a power supply terminal connected to a power supply voltage, and a ground terminal connected to ground.

6. The power amplifier circuit of claim 1, wherein the driver stage circuit comprises a plurality of amplifiers connected in series.

7. The power amplifier circuit of claim 6, wherein a subsequent amplifier of the plurality of amplifiers has a gain higher than a gain of a preceding amplifier to have an output signal swing of the subsequent amplifier that is higher than an output signal swing of the preceding amplifier.

8. The power amplifier circuit of claim 6, wherein each of the plurality of amplifiers is an inverting amplifier.

9. The power amplifier circuit of claim 1, wherein the output stage circuit comprises a class D switching type structure.

10. The power amplifier circuit of claim 1, wherein the differential to single ended converter comprises a folded cascade structure.

11. A power amplifier circuit, comprising:
a differential to single ended converter, a gain stage circuit, a driver stage circuit, and an output stage circuit connected in series; and
a bias circuit connected to a bias voltage port of the gain stage circuit for adjusting a bias voltage of the gain stage circuit, wherein the output stage circuit is connected to a series resonant network.

12. The power amplifier circuit of claim 11, wherein the gain stage circuit comprises:
at least one amplifier having an input terminal connected to the bias voltage port, a power supply terminal connected to a power supply voltage, and a ground terminal connected to ground.

13. The power amplifier circuit of claim 11, wherein the driver stage circuit comprises a plurality of amplifiers connected in series.

14. A method for forming a power amplifier circuit having a differential to single ended converter, a gain stage circuit, a driver stage circuit, an output stage circuit, and a bias circuit, the method comprising:
connecting the differential to single ended converter, the gain stage circuit having a bias voltage port, the driver stage circuit, and the output stage circuit in series;
connecting the bias circuit to the bias voltage port of the gain stage circuit so as to adjust a bias voltage of the gain stage circuit,
wherein the bias circuit comprises:
a first current source group including a plurality of first current sources, each of the first current sources having a first terminal connected to a power supply voltage through a first switch, and a second terminal connected to the bias voltage port; and
a second current source group including a plurality of second current sources, each of the second current sources having a third terminal connected to the bias voltage port through a second switch, and a fourth terminal connected to ground.

15. The method of claim 14, wherein the bias circuit further comprises:
a transmission gate control unit connected to the second terminal of each of the first current source group, the third terminal of each of the second current source group, and the bias voltage port of the gain stage circuit.

16. The method of claim 15, further comprising:
adjusting the bias voltage of the gain stage circuit by turning on and off the first current sources of the first current source group and the second current sources of the second current source group.

17. The method of claim 15, further comprising:
controlling an operation state of the first current source group and the second source current group through the transmission gate control unit.

18. The method of claim 17, wherein the transmission gate control unit comprises:
a first PMOS transistor having a gate connected to a first terminal of a first switch group and a first terminal of a second switch group, a source connected to the power supply voltage, and a drain connected to a second terminal of the bias voltage port and a second terminal of the second switch group; and
a first NMOS transistor having a gate connected to a first terminal of a third switch group and a first terminal of a fourth switch group, a drain connected to the bias voltage port and a second terminal of the third switch group, a source connected to ground, the fourth switch group having a second terminal connected to the source of the first NMOS transistor;
an enable input terminal connected to the gate of a second PMOS transistor of the first switch group, the gate of a third NMOS transistor of the second switch group, the gate of a fourth NMOS transistor of the third switch group, and the gate of a fifth PMOS transistor of the fourth switch group;
an inverted enable input terminal connected to the gate of a second NMOS transistor of the first switch group, the gate of a third PMOS transistor of the second switch group, the gate of a fourth PMOS transistor of the third switch group, and the gate of a fourth NMOS transistor of the fourth switch group.

19. The method of claim 18, wherein controlling an operation state of the first current source group and the second source current group through the transmission gate control unit comprises:
turning off the first PMOS transistor and the first NMOS transistor of the transmission gate control unit to set the first current source group and the second current source group in an in active state; and
turning on the first PMOS transistor and the first NMOS transistor of the transmission gate control unit to set the first current source group and the second current source group in an active state.

20. The method of claim 19, wherein the first PMOS transistor and the first NMOS transistor in the transmission gate control unit are turned off when the enable input terminal is at a low level; and
the first PMOS transistor and the first NMOS transistor in the transmission gate control unit are turned on when the enable input terminal is at a high level.

* * * * *